(12) United States Patent
von Koblinski (10) Patent No.: US 12,255,162 B2
(45) Date of Patent: Mar. 18, 2025

(54) SEMICONDUCTOR DEVICE, SEMICONDUCTOR COMPONENT AND METHOD OF FABRICATING A SEMICONDUCTOR DEVICE

(71) Applicant: Infineon Technologies Austria AG, Villach (AT)

(72) Inventor: Carsten von Koblinski, Villach (AT)

(73) Assignee: Infineon Technologies Austria AG, Villach (AT)

( * ) Notice: Subject to any disclaimer, the term of this patent is extended or adjusted under 35 U.S.C. 154(b) by 1160 days.

(21) Appl. No.: 16/593,614

(22) Filed: Oct. 4, 2019

(65) Prior Publication Data
US 2020/0111759 A1    Apr. 9, 2020

(30) Foreign Application Priority Data
Oct. 5, 2018 (EP) ..................... 18198981

(51) Int. Cl.
| | | |
|---|---|---|
| *H01L 23/48* | (2006.01) | |
| *H01L 21/3065* | (2006.01) | |
| *H01L 21/768* | (2006.01) | |
| *H01L 23/00* | (2006.01) | |
| *H01L 23/498* | (2006.01) | |
| *H01L 29/34* | (2006.01) | |

(52) U.S. Cl.
CPC .......... *H01L 24/06* (2013.01); *H01L 21/3065* (2013.01); *H01L 21/76898* (2013.01); *H01L 23/481* (2013.01); *H01L 23/49822* (2013.01); *H01L 24/03* (2013.01); *H01L 24/04* (2013.01); *H01L 24/48* (2013.01); *H01L 29/34* (2013.01); *H01L 2224/03502* (2013.01); *H01L 2224/04042* (2013.01); *H01L 2224/06181* (2013.01); *H01L 2224/48227* (2013.01)

(58) Field of Classification Search
CPC . H01L 23/522; H01L 23/4334; H01L 23/485; H01L 23/5385; H01L 24/05
See application file for complete search history.

(56) References Cited

U.S. PATENT DOCUMENTS 10,672,664 B2 * 6/2020 Ganitzer ............... H01L 21/762
2005/0233568 A1 10/2005 Noritake et al.
(Continued)

FOREIGN PATENT DOCUMENTS

| | | |
|---|---|---|
| CN | 102347299 A | 2/2012 |
| CN | 103887250 A | 6/2014 |

(Continued)

OTHER PUBLICATIONS

Further, adj. meanings, etymology and more—Oxford English Dictionary.*

*Primary Examiner* — Hoa B Trinh
(74) *Attorney, Agent, or Firm* — Murphy, Bilak & Homiller, PLLC (57) ABSTRACT

In an embodiment, a semiconductor device includes a semiconductor body having a first major surface, a second major surface opposing the first major surface and at least one transistor device structure, a source pad and a gate pad arranged on the first major surface, a drain pad and at least one further contact pad coupled to a further device structure. The drain pad and the at least one further contact pad are arranged on the second major surface.

20 Claims, 8 Drawing Sheets

(56) References Cited

U.S. PATENT DOCUMENTS

| | | | |
|---|---|---|---|
| 2012/0061835 A1* | 3/2012 | Hosseini | H01L 24/48 257/E23.024 |
| 2014/0111956 A1 | 4/2014 | Taniguchi | |
| 2014/0246790 A1* | 9/2014 | Haney | H01L 21/50 438/106 |
| 2016/0268421 A1* | 9/2016 | Shinohara | H01L 23/481 |
| 2019/0088550 A1* | 3/2019 | Ganitzer | H01L 24/05 |

FOREIGN PATENT DOCUMENTS

| | | |
|---|---|---|
| CN | 107017211 A | 8/2017 |
| KR | 20180065334 A | 6/2018 |

\* cited by examiner

SEMICONDUCTOR DEVICE, SEMICONDUCTOR COMPONENT AND METHOD OF FABRICATING A SEMICONDUCTOR DEVICE

BACKGROUND

Transistors are used in power electronic applications for switching. Common transistor devices for power applications include Si CoolMOS®, Si Power MOSFETs, and Si Insulated Gate Bipolar Transistors (IGBTs). A vertical MOSFET has a vertical drift path and includes a source pad and a gate pad on an upper surface and a drain pad on a lower surface of a semiconductor die including the transistor structure.

US 2014/0319602 A1 discloses a semiconductor die having two electrical isolated regions. A power transistor is disposed in the first region and a gate driver transistor is arranged in the second region.

Devices that include additional functions in addition to the main function of a power transistor for power switching a are desirable.

SUMMARY

In an embodiment, a semiconductor device comprises a semiconductor body comprising a first major surface, a second major surface opposing the first major surface and at least one transistor device structure, a source pad and a gate pad arranged on the first major surface, a drain pad and at least one further contact pad coupled to a further device structure. The drain pad and the at least one further contact pad are arranged on the second major surface.

In an embodiment, a method of fabricating a semiconductor device comprises providing a semiconductor body comprising a first major surface, a second major surface opposing the first major surface, at least one transistor device structure, a further device structure, a source pad and a gate pad arranged on the first major surface, and an insulating layer comprising one or more discrete portions arranged on the second major surface. The method further comprises depositing a photoresist layer onto the second major surface of the semiconductor body, increasing the surface roughness of predefined areas of the photoresist layer and producing a surface profile, plasma etching the semiconductor body, whereby the surface profile of the photoresist layer is transferred to the second major surface of the semiconductor body such that the second major surface is roughened in regions laterally adjacent the discrete portions of the insulating layer, depositing a seed layer on the roughened regions and on the discrete portions of the insulating layer, depositing a conductive layer on the seed layer, structuring the seed layer and the conductive layer and forming a drain pad and at least one further contact pad on the second major surface, the further contact pad being electrically coupled to the further device structure.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 6a to 6f illustrate a method for fabricating a semiconductor device.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
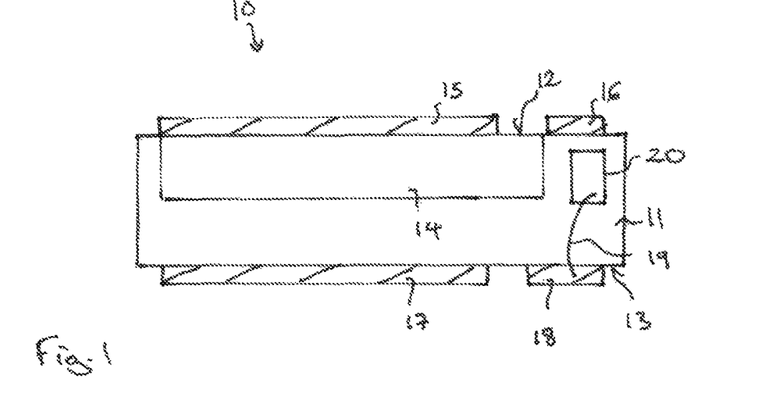
FIG. 1 illustrates a cross-sectional view of a semiconductor device according to an embodiment.

FIG. 1 illustrates a cross-sectional view of a semiconductor device 10 according to an embodiment. The semiconductor device 10 includes a semiconductor body 11 comprising a first major surface 12 and a second major surface 13 opposing the first major surface 12. The semiconductor body 11 comprises at least one transistor device structure 14. The semiconductor body 11 may be referred to as a semiconductor die or semiconductor chip. The semiconductor device 10 includes a source pad 15 and a gate pad 16 arranged on the first major surface and a drain pad 17 arranged on the second major surface 13. The semiconductor device 10 also comprises a further contact pad 18 which is arranged on the second major surface 13. The further contact pad 18 is coupled, as indicated schematically by line 19, to a further device structure 20.

The transistor device 14 may be a power switch and may be a vertical FET (Field Effect Transistor) device, for example a MOSFET with a vertical drift path, with the source pad 15 and the drain pad 16 arranged on opposing major surface of the semiconductor body 11.

The further device structure 20 is positioned in or on the semiconductor body 11. The further device structure 20 includes a structure with which a parameter of a device can be changed, for example a voltage, or a current. The further device structure 20 may include a substructure with which a parameter of a device can be changed, for example by applying a voltage, current. In some embodiments, the further device structure includes a substructure for changing a driver signal. The driver signal may be a gate driver signal that is applied to the transistor device 14 of the semiconductor device 10. The transistor device 14 may provide power switching. In some embodiments, the further device structure or substructure 20 can be used to increase the switching frequency of the transistor device 14 in the semiconductor body 11.

The further device structure 20 may be physically separate and electrically isolated from the transistor device structure 14 and from the remainder of the semiconductor body 11.

The semiconductor device 10 includes a second major surface 13, which is typically referred to as the rear surface of the semiconductor body 11, which includes an additional function in addition to the switching transistor device structure function provided by the drain pad 17. The semiconductor device 10 can be described as having a functionalised rear surface. This arrangement may be useful in embodiments in which the semiconductor device 10 is used in a so-called source down arrangement in which the source pad 15 and gate pad 16 face towards, and are mounted on, a redistribution substrate, such as a lead frame and the drain pad 17 faces upwards away from the redistribution substrate. By including the one or more further contact pads 18 on the second major surface 13, which in the source down position of the semiconductor die 11 faces upwards, the number of conductive redistribution traces or leads which have to be provided by the redistribution substrate can be reduced, for example to just the source pad 15 and gate pad 16, and the number of contact pads on the second major surface 13, which are electrically contacted by other means, is increased. Providing an electrical connection to the upwardly facing surface, which is now the second major surface 13, may be more simply achieved by the use of an additional electrical connector, such as a bond wire, a contact clip connection, for example.

The semiconductor device 10 is not limited to a transistor device 21 having contact pads denoted as source, drain and gate as is the case, for example, for MOSFET device. The semiconductor die may also include insulated gate bipolar transistor (IGBT) or a bipolar junction transistor (BJT), for example, for which the terminology for these elements commonly differs from that used for a MOSFET device. In which case, for IGBT devices, the source is an emitter and the drain is a collector. For BJT devices, the source is an emitter, the drain is a collector contact pad and gate is a base. Therefore, as used herein "source" also includes emitter, "drain" also includes collector and "gate" also includes base as is appropriate for the type of transistor device.

Figure 2:
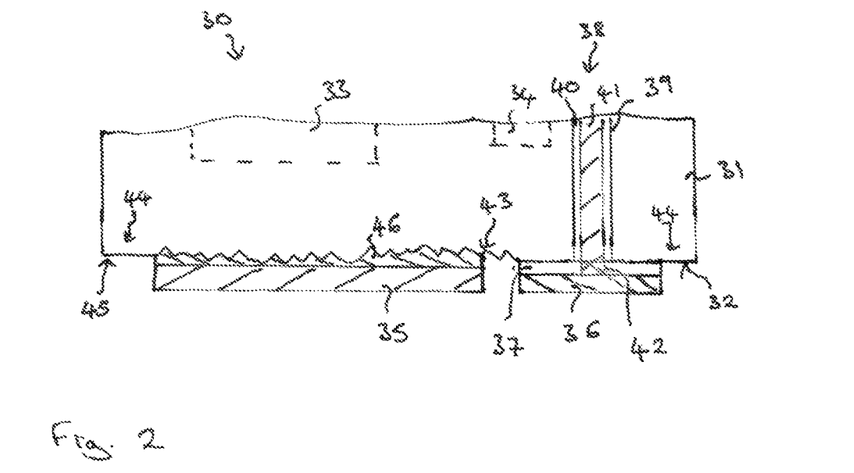
FIG. 2 illustrates a partial cross-sectional view of a semiconductor device according to an embodiment.

FIG. 2 illustrates a partial cross-sectional view of a semiconductor device 30 according to an embodiment. The semiconductor device 30 has a semiconductor body 31 which includes a first major surface, which is not which cannot be seen in the partial cross-sectional view of FIG. 2, and a second major surface 32 which opposes the first major surface. As in the embodiment illustrated in FIG. 1, the semiconductor the body 31 includes at least one transistor device structure 33 and at least one further device structure 34. A drain pad 35 and a further contact pad 36, which is laterally spaced apart from the drain pad 35, are arranged on the second major surface 32. The transistor device structure 33 may be a vertical power transistor device for power switching.

The further contact pad 36 is spaced apart from and electrically insulated from the semiconductor body 31 by an insulating layer 37 which is arranged between the further contact pad 36 and the second major surface 32. The insulating layer 37 may have a defined area and be considered to be a discrete portion of the insulating layer 37. The drain contact pad 35 may be positioned directly on the second major surface 32 in order to make a low ohmic connection to a drain region of the transistor device 33 positioned at the second major surface 32 of the semiconductor body 31.

In some embodiments, the semiconductor device 30 may include a conductive via 38 which is electrically coupled to the further contact pad 36 and which is electrically insulated from the semiconductor body 31. The conductive via 38 may be used to couple the further contact pad 36 to the further device structure 34.

The conductive via 38 may be provided by a via or through-hole 39 which is positioned in, and defined by the material, of the semiconductor body 31. The through-hole 39 is lined with an insulating material 40 and conductive material 41 is positioned in the through-hole 39 and is electrically insulated from the semiconductor body 31 by the insulating layer 40 to form the conductive via 38. The insulating layer 40 may be in contact with the insulating layer 37 arranged on the second major surface 32 of the semiconductor die 31 and the conductive material 41 may be in contact with the further contact pad 36.

The insulating layer 37 includes a discrete portion comprising an aperture 42. In some embodiments, the further contact pad 36 may extend into the opening 42 and make contact with the conductive material 41 positioned in the conductive via 38. The further contact pad 36 is not in direct contact with the semiconductor body 31 due to the insulating layer 37 arranged between the second major surface 32 of the semiconductor body 31 and the further contact pad 36 and due to the insulating lining 40 of the conductive via 38.

In other embodiments, the further contact pad 36 extends into the aperture 42 and is in contact with the second major surface 32 of the semiconductor body 31. For example, the further device structure 34 may be positioned at the rear surface 32 so that the portion of the further contact pad 36 which extends into the opening 42 is in contact with the further device structure 34. The further device structure 34 may be electrically isolated from the transistor structure 33. For example, the further device structure 34 may be arranged in a well in the semiconductor body 31 that is lined with an insulating layer. The further contact pad 36 may be spaced part from the surrounding portions of the second major surface 32 of the semiconductor body 31 by the ring-shaped discrete insulating layer 37.

The discrete portion of the insulating layer 37 can be considered to have a ring-shape which surrounds the aperture 42. The outer contour may have different forms, for example square, rectangular, circular or hexagonal. In some embodiments, the discrete portion may have a U-shape such that the contact pad 36 is positioned on the U-shaped insulating layer and extends into the opening provided by the arms of the U-shape to make contact with the second major surface 32 or a conductive via, for example. In some embodiments, the discrete portion of the insulating layer 37 includes an extension extending from at least one side of a ring-shape. The discrete portion may have an L-shape or an elongate shape with the aperture or opening positioned at a distal end. In this embodiment, the aperture of the ring-shape can be considered to be asymmetrically positioned in the discrete portion of the insulating layer. The ring-shape may have a different thickness to the extension or the same thickness. The further contact pad 36 may extend onto the extension to increase its lateral area whilst remaining electrically insulated from the semiconductor body 31 positioned underneath.

In some embodiments, the second major surface 32 of the semiconductor body 31 of the semiconductor device 30 includes a roughened surface. In some embodiments, the entire second major surface includes a roughened surface. In some embodiments, the peripheral region is smoother, that is has a lower surface roughness, than the central region of the second major surface.

In some embodiments, such as that illustrated in FIG. 2, predefined regions of the second major surface 32 are roughened to form roughened regions 43 and other portions of the second major surface 32 remain unroughened and form unroughened regions 44. The unroughened portions 44 have a lower surface roughness than the roughened regions 43. One or more unroughened regions 44 may be positioned at the periphery of the second major surface 32, for example in the kerf region 45 or in a region of the second major surface 32 which is covered by the insulating layer 37 and, in particular, the discrete portions of the insulating layer 37.

In some embodiments, the roughened surface 43 is provided in regions of the second major surface 32 which are uncovered by the insulating layer 37. The roughened surface 43 may be positioned under the drain pad 35.

In some embodiments, a seed layer 46 is positioned on the roughened surface 43 and the drain contact pad 35 is positioned on the seed layer 46. In some embodiments, the seed layer 46 is positioned on the insulating layer 37 and forms part of the further contact pad 36. The seed layer may also be arranged on unroughened regions 44 of the second major surface.

The roughened surface 43 may be used to increase the adhesion of one or more of the contact pads, for example the drain contact pad 35 to the semiconductor body 31.

Figure 3:
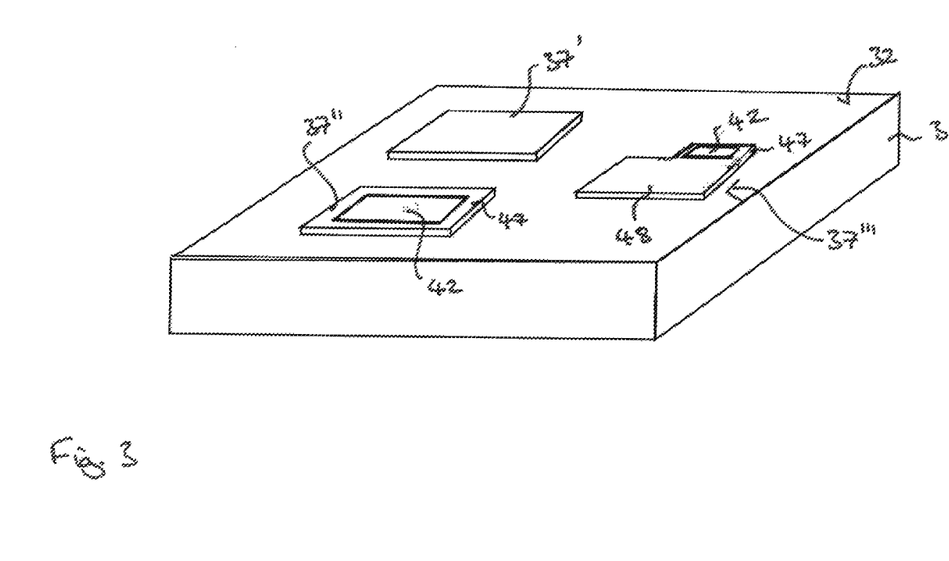
FIG. 3 illustrates a perspective view of a rear surface of a semiconductor device.

FIG. 3 illustrates embodiments of discrete insulting portions on the rear surface of a semiconductor body. As an example, the rear surface 32 of semiconductor body 31 of FIG. 2 is illustrated. Three different forms for the discrete insulating regions 37 are illustrated as examples. In an embodiment, the discrete insulating region 37' has a closed uniform structure and may have square or rectangular form. The discrete portion 37' may have a lateral form which varies from square or rectangular, for example, it may have a circular, oval, hexagonal region or an irregular form.

In another embodiment, the discrete insulating region 37" has a ring form 47 surrounding an opening 42 in which a portion of the second major surface 32 of the semiconductor body is exposed. In another embodiment, the discrete portion 37'" has a ring-shaped form 47 having an opening 42 in which the second major surface 32 is exposed, and an integral extension 48. The extension 48 may have a substantially square or rectangular shape. However, the extension 48 may have other forms, for example rounded or semi-circular. In some embodiments, the lateral contour of the discrete portion 37'" may be L-shaped, with the opening 42 positioned in one of the limbs.

In embodiments in which two or more discrete insulating regions are arranged on the surface, the two or more discrete insulating regions may have the same or different shapes.

Figure 4:
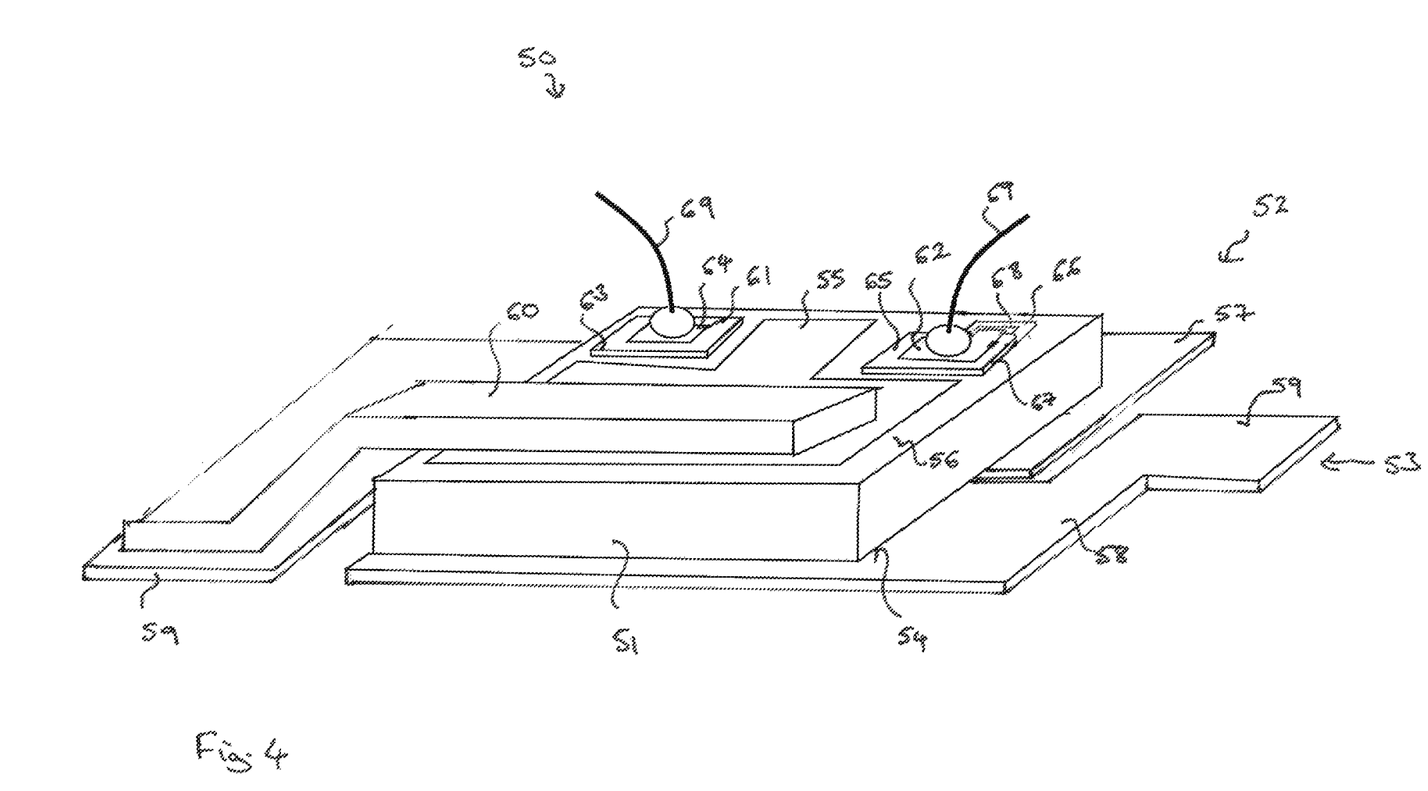
FIG. 4 illustrates a perspective view of a semiconductor device mounted in a package.

FIG. 4 illustrates a perspective view of an arrangement 50 of the semiconductor device 51 mounted in a package 52. The package 52 includes a conductive redistribution structure 53 which may have the form of a lead frame or conductive traces positioned on an insulating board. The package 52 also includes a housing in the form of a moulding which may include epoxy resin, for example, which is not illustrated in FIG. 4. The semiconductor device 51 includes a transistor device structure, which cannot be seen in FIG. 4, a gate pad and source pad on its first major surface 54 and a drain pad 55 on its second major surface 56. The first major surface 54 of the semiconductor device 51 faces downwards towards the upper surface 59 of the redistribution structure 53 so that the source and gate pads cannot be seen in the perspective view of FIG. 4. The semiconductor device 51 is mounted on the redistribution substrate 53 such that the gate pad is mounted on a first trace 57 by a conductive connection, for example a solder connection and such that the source pad is mounted on and connected to a second trace 58 by conductive connection, such as a solder connection. The conductive trace 57 is spaced apart from the conductive trace 58.

The drain pad 55 on the second major surface 56 faces upwardly away from the redistribution structure 53 and is electrically connected to a third conductive portion 59 of the redistribution structure 53 which is spaced apart from and adjacent to the semiconductor device 51 by a conductive connector 60. The conductive connector 60 may have the form of a contact clip or one or more bond wires, for example.

The semiconductor device 51 has a second major surface 56 including the drain pad 55 and one or more further contact pads 61, 62 which are connected to one or more further device structures within the semiconductor device 51. The second major surface 56 therefore provides additional functionality in addition to the function of the drain pad 55 of the transistor device of the semiconductor device 51.

In addition to the drain pad 55, the second major surface 56 of the semiconductor device 51 includes two further contact pads 61, 62. The first contact pad 61 is positioned on a discrete insulating region 63 which has a ring form. The contact pad 61 is arranged on the insulating region 63 and extends into the opening 64 defined by the ring form. The outer surface of the contact pad 64 is substantially planar such that the opening 64 defined by the ring-shaped discrete portions 63 is substantially filled with conductive material. The contact pad 61 is electrically coupled to a further device structure within the semiconductor device 51. The contact pad 61 is electrically coupled to a non-illustrated portion of the redistribution structure 53 by a bond wire 59.

The contact pad 62 is arranged on a discrete portion 65 of an insulating layer. The discrete portion 65 has a portion having a ring form 66 and an extension 67 that extends from one side of the ring 66. The ring form 66 defines an opening 68 into which the contact pad 62 extends. The contact pad 62 extends over the extension portion 67 which provides an increased area for attaching a bond wire 69. The bond wire 69 is positioned on the contact pad 62 and is positioned laterally adjacent to the opening 68 in the ring portion 66 and to the electrical connection formed between the contact pad 62 and the second major surface 56. The increased area of the contact pad 62 enabled by the extension 67 enables the bond wire 69 to be more easily formed. This arrangement of the discrete insulating portion 65, contact pad 62 and bond wire 69 may be used to avoid damage to the underlying device structure to which the contact pad 62 is electrically coupled during formation of the bond wire 69, since the bond wire 69 is positioned on the insulating layer 65 which is positioned between the contact pad 62 and the second major surface 56 of the semiconductor device 51.

Different types of electrical connections can be used to connect the contact pads 61, 62 on the second rear surface 56 to portions of the redistribution layer. For example, the drain pad 55 may be connected by large area conductive connector, such as a contact clip, to the portion of the 59 of the redistribution structure 53 and the contact pads 61, 62 may each be coupled to portions of the redistribution structure 53 by a bond wire. In other embodiments, the same type of connector may be used for each of the contact pads. In some embodiments, the type of connector may be substantially the same for each contact pad but differ in size. For example, the diameter of the bond wire may vary for one or more of the contact pads. For example, the one or more further contact pads 61, 62 may be connected to the redistribution structure 53 by a bond wire having a smaller diameter and than a bond wire or wires connecting the drain pad 55 to the redistribution structure 53.

Figure 5A:
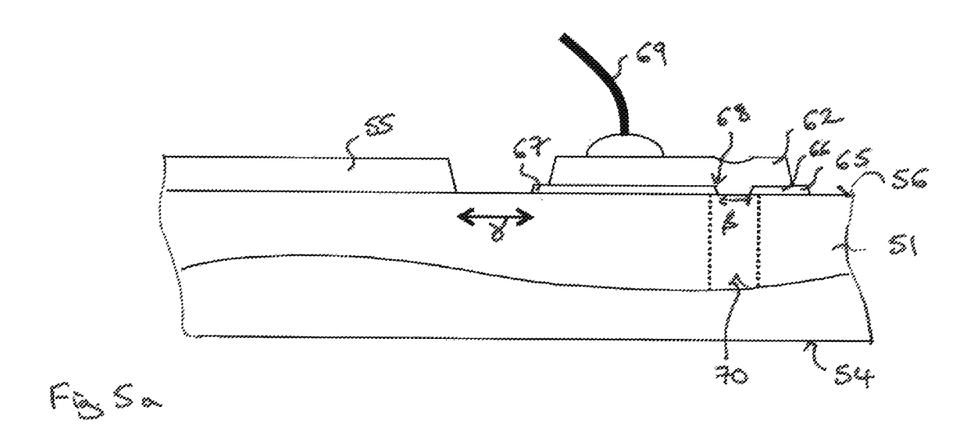
FIG. 5a illustrates a cross-sectional view of a contact pad on a rear surface of the semiconductor device according to an embodiment.
Figure 5B:
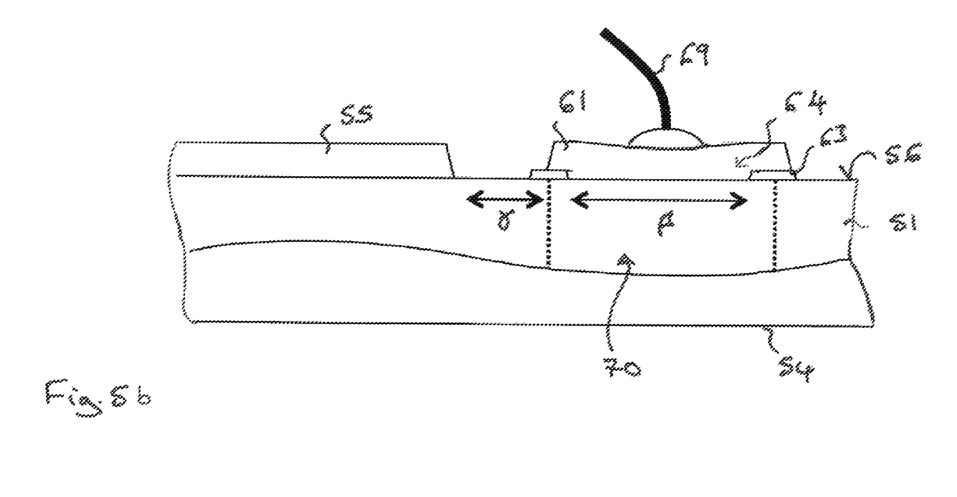
FIG. 5b illustrates a cross-sectional view of a contact pad on a rear surface of a semiconductor device according to an embodiment.

FIGS. 5a and 5b illustrate respective cross-sectional views of two further contact pads of differing form. The further contact pads 61, 62 illustrated in FIG. 4 are used as an example of the different forms.

FIG. 5a illustrates a cross-sectional view of the further contact pad 62 and illustrates that the conductive material of the contact pad 62 extends into the opening 68 in the insulating layer 65 and onto the extension portion 67 which is arranged laterally adjacent the opening 68. The contact pad 62 has a lateral extent which is less than the lateral extent of the discrete insulating portion 65 such that the discrete insulating portion 65 protrudes laterally outwardly from the conductive material of the further contact pad 62. This arrangement may be used to assist in increasing the electrical isolation of the contact pad 62 from the semiconductor device 51.

The opening 68 in the discrete insulating portion 65 has a width $\beta$. The width $\beta$ is selected depending on the lateral size of the structure 70 in the semiconductor body 51 to which the further contact pad 62 should be coupled. For example, the structure 70 underlying the contact pad 62 may include a conductive contact via coupled to a further device structure. This type of structure 70 is relatively small so that lateral shape of the discrete portion 65 of the insulating layer and the contact pad 62 increases the available area to which the bond wire 69 can be connected. The bond wire 69 is positioned laterally adjacent and spaced apart from the structure 70. The further contact pad 62 and the discrete insulating layer 65 are separated by a distance $\gamma$ from the drain contact pad 55. The distance $\gamma$ can be selected depending on the difference in potential to which the contact pads 55, 62 are subjected in operation.

FIG. 5b illustrates a cross-sectional view of the contact pad 61 and insulating portion 63. The contact pad 61 differs from the contact pad 62 in the size $\beta$ of the aperture 64 with respect to the size of the bond wire 69 and the underlying structure 70. In the embodiment illustrated in FIG. 5B, the structure 70 and opening 64 are larger than the bonding area required by the bond wire 69. In this embodiment, the bond wire 69 is positioned directly above the structure 70.

A method of fabricating a semiconductor device with a functionalised rear surface will be described with reference to FIGS. 6a to 6f.

Figure 6A:
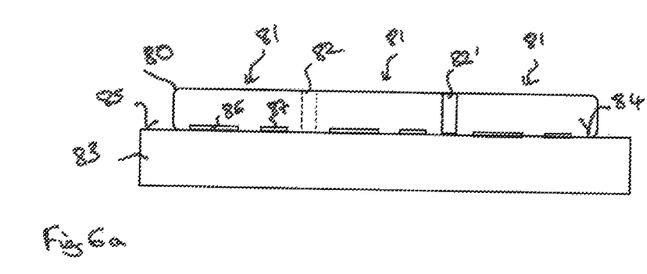

FIG. 6a illustrates a semiconductor wafer 80 including a plurality of device positions 81 which are laterally separated by kerf regions 82. The device positions 81 may be arranged in rows and grids such that the kerf regions 82 form a square or rectangular grid.

In some embodiments, the kerf regions 82 may be include the semiconductor material of the wafer 80. In other embodiments, the kerf regions 82' may include an insulating material, which may extend throughout the entire thickness of the semiconductor wafer 80.

FIG. 6a illustrates the semiconductor wafer 80 positioned on a carrier 83 such that its first major surface 84, which is commonly referred to as the front side, is fixed onto a surface 85 of the carrier 83, for example, using adhesive. The device positions 81 of the semiconductor wafer 80 have been processed such that the first major surface 84 includes a source pad 86 and drain pad 87. The processing of the front side 84 may be complete at this stage.

Figure 6B:
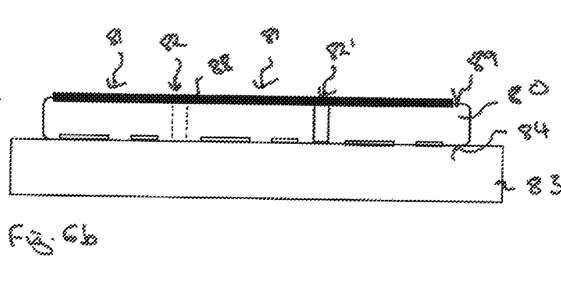
Figure 6C:
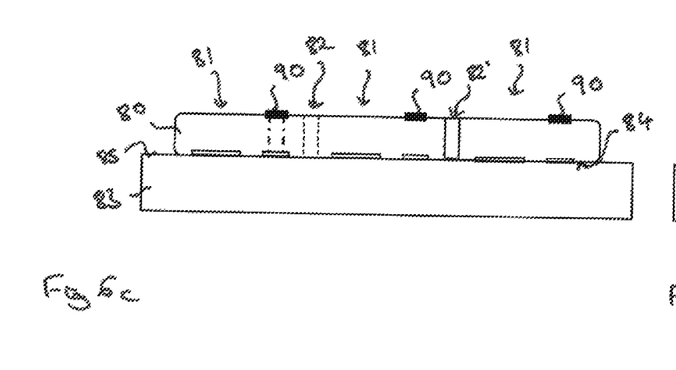

As illustrated in FIG. 6b, an insulating dielectric layer 88 is applied to the second major surface 89 of the semiconductor wafer 80 and then structured to provide one or more discrete portions 90 in each device position 81, as is illustrated in FIG. 6c.

Figure 6D:
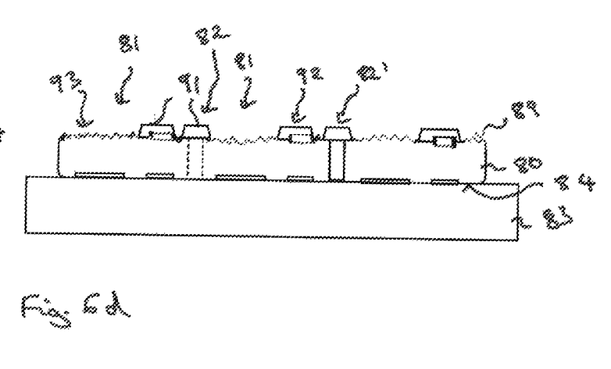

In some embodiments, the second major surface 89 is then roughened. In some embodiments, selected areas of the second major surface 89 are roughened. As illustrated in FIG. 6d, in these embodiments, a structured mask 91 may be applied to the second major surface 89 to cover regions of the second major surface 89 which are to remain untreated, i.e. unroughened. For example, the mask 91 may cover the kerf regions 82 and peripheral edge regions of the device positions 81. The mask 91 may also cover the discrete portions 90 of the insulating layer. The second major surface 89 may then be subjected to a roughening treatment such that the regions 92 which remain uncovered by the mask 91 have an increased surface roughness compared to the regions 93 of the second major surface 89 that are covered by the mask 91.

In some embodiments, the roughening process is carried out by applying a photoresist layer and spatially nonuniformly curing the photoresist layer so as to increase the surface roughness of the photoresist layer. The wafer 80 is then subjected to a plasma etch process such that the surface profile of the roughened surface of the photoresist layer is transferred to the second major surface 89. This method of roughening the second major surface 89 will be described in more detail connection with FIGS. 7*a* to 7*e*.

Figure 6F:
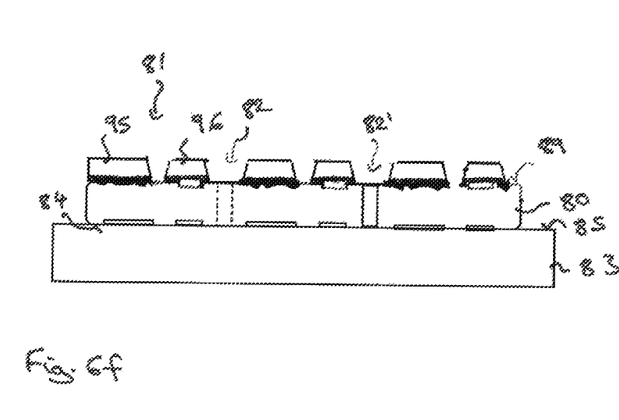

As is illustrated in FIG. 6*e*, the method for fabricating a semiconductor device continues by removing the mask 91 after the roughening process, if a mask is used. A seed layer 93 is deposited, for example by sputtering, to the second major surface 89 and the thickness of the seed layer 93 is increased by applying further conductive layer 94 to the seed layer 93. The further conductive layer 94 may be deposited by sputtering or electroplating, for example. The seed layer 93 and the conductive layer 94 are deposited onto the discrete portions 90 of the insulating layer as well as onto the exposed portions of the second major surface 89. As illustrated in FIG. 6*f*, the conductive layer 94 and seed layer 93 may be structured to produce a drain contact pad 95 and one or more further contact pads 96 on the second rear surface 89 in each of the device positions 81. The kerf regions 82 remain free of the conductive layer.

Alternatively, the contact pads 55, 61, 62 may be formed using a single conductive layer. Alternatively, the conductive layer 94 may be selectively deposited to from the contact pads 55, 61, 62 on a continuous seed layer 93 or on a selectively deposited seed layer.

FIGS. 7*a* to 7*e* illustrate an embodiment of a method for controlling the surface roughness areas of predetermined regions of a surface with reference to the semiconductor wafer 80 of FIGS. 6*a* to 6*f*.

Figure 7A:
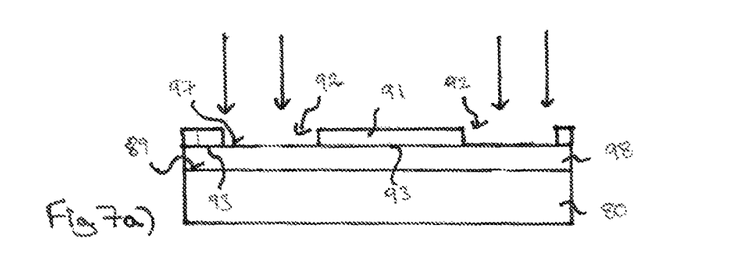
FIGS. 7a to 7e illustrate a method of increasing the surface roughness of a surface of a semiconductor device.

As illustrated in FIG. 7*a*, a mask 91 is applied to the outermost surface 97 of a photoresist layer 98 which has been deposited onto a surface 89 of the semiconductor wafer 80, whereby both the surface 97 of the photoresist layer 98 and the surface 89 of the substrate 80 have an initial surface roughness. The mask 91 includes openings 92 in which regions of the photoresist layer 98 are exposed. This arrangement is subjected to illumination, whereby the areas 92 of the photoresist layer 98 exposed by the mask 91 and forming the base of the openings 92 are spatially non-uniformly illuminated and spatially non-uniformly cured so that the surface roughness of the photoresist layer 98 in the openings 92 in the mask 91 is increased. The areas 93 of the photoresist layer 98 which are covered by the mask 91 remain substantially unaffected by the plasma etch process. After removal of the mask 91, the photoresist layer 98 has a surface profile 97' with predefined areas 99, 100 having different surface roughnesses The areas 99 which were covered by the mask 91 have a lower surface roughness than the area 100 which were illuminated and positioned in the openings 92 of the mask 91. The areas 100 have a higher surface roughness than the initial surface roughness of the surface 97 of the photoresist layer 98 after deposition, as illustrated in FIG. 7*b*.

Figure 7B:
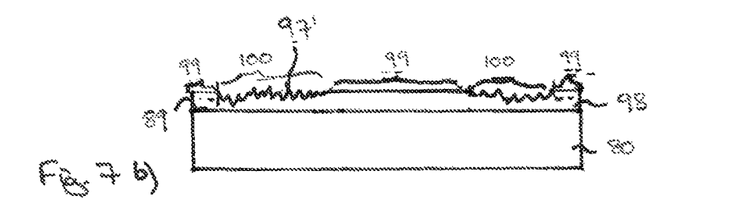
Figure 7C:
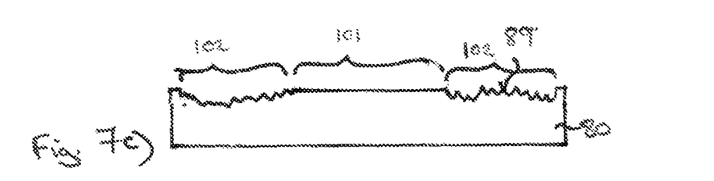

The intermediate product illustrated in FIG. 7*b* is then subjected to a plasma etch such that the surface profile 97' of the photoresist layer 91 is transferred to the surface 89 of the wafer 80 thus producing one or more areas 102 having a higher surface roughness than other areas 101 of the second major surface 89 of the wafer 80, as is illustrated in FIG. 7*c*.

In some embodiments, the surface profile formed in the roughened areas 102 of the wafer 80 may be characterised by two different types of feature having dimensions of differing scales.

Figure 7D:
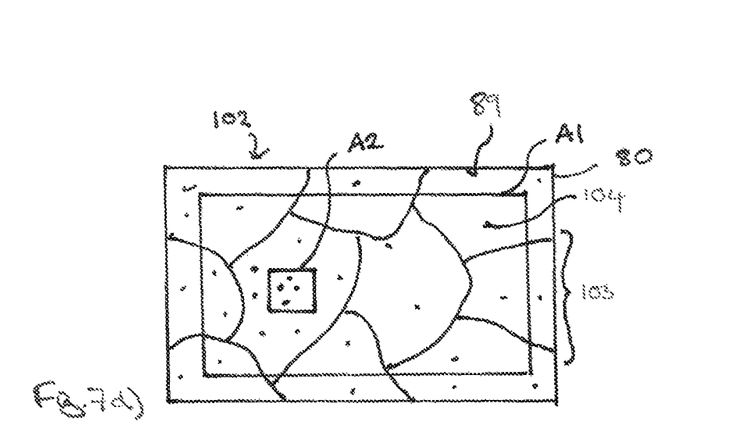
Figure 7E:
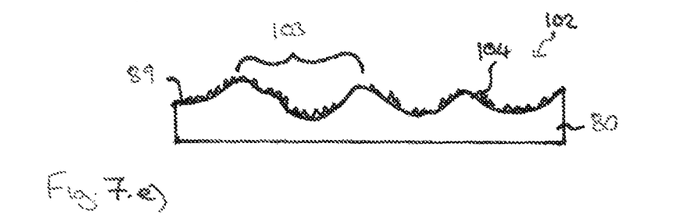

FIG. 7*d* illustrates a plan view and FIG. 7*e* a cross-sectional view of a surface 89 which has been roughened according to the method described with reference to FIGS. 7*a* to 7*c*. The roughened area 102 of the second major surface 89 includes a first type of feature 103 and a second type of feature 104. The first type of feature 103 is much coarser than the second type of feature 104. The first type of feature 103 is formed from a plurality of craters forming large peaks and valleys. The second type of feature 104 forms a surface feature on the coarse first surface feature 103. For example, the first surface features 103 may have an average size of 5 μm and the second features 104 have an average size of 200 nm.

In some embodiments, the first features 103 have a surface roughness $R_{a1}$ measured over an area $A_1$ and the second surface features 104 have a second surface roughness $R_{a2}$ measured over an area A2. The area $A_2$ lies entirely within the area A1 so that the area $A_1$ is greater than the area $A_2$. In some embodiments, $R_{a1} \neq R_{a2}$. In some embodiments, $R_{a1}$ is greater than $R_{a2}$. In some embodiments, the second major surface 89 has a surface roughness $R_{a3}$ outside of the area $A_1$ whereby the surface roughness $R_{a3}$ is less than the surface roughness $R_{a2}$ and less than the surface roughness $R_{a1}$. For example, the kerf regions 82 may have roughness $R_{a3}$ and the areas 102 of the wafer 80 may have a surface morphology as illustrated in FIGS. 7*d* and 7*e*.

The surface 89 of the substrate 80 may have an initial roughness $R_{ai}$, which, in some embodiments, lies in the range of 1 to 10 nm. The roughened areas 102 of the surface 89 may have an arithmetic surface roughness $R_a$ which lies in the range of 10 nm to 500 nm or 75 nm to 350 nm.

As used herein, the surface roughness or $R_a$ refers to the arithmetic roughness. Any values of surface roughness given herein refer to the arithmetic roughness. The arithmetic roughness $R_a$ is the arithmetic average of the absolute measured profile values and may be used as a global measure of the roughness amplitude of the surface profile. The arithmetic average $R_a$ is calculated for a line profile. The arithmetic average for an area is denoted as $R_{a2D}$.

This surface roughening methods comprises increasing the initial surface roughness of a photoresist layer deposited onto a surface of the substrate, thereby increasing the surface roughness of the photoresist layer to produce a surface profile on the photoresist layer that is then transferred to the surface of the substrate such that the surface of the substrate is roughened and has a surface roughness which is higher than the initial surface roughness of the substrate.

The photodefinable or photostructurable properties of the photoresist layer 98 can be used to increase the surface roughness of the outermost surface 97 of the photoresist layer 98.

Apparatus for increasing the surface roughness of the photoresist layer 98 may include a light source which is used to illuminate the photoresist layer 98 positioned on the surface 89 of the wafer 80. An optical filter may be placed between the light source and the photoresist layer 98 and Light from the light source is directed through the optical filter 21 and onto the outermost surface 97 of the photoresist layer 98, so that the photoresist layer 98 is spatially non-uniformly illuminated by the light from the light source and is, therefore, spatially nonuniformly cured.

As used herein spatially nonuniformly refers to the area as well as the depth and, consequently, non-uniformly curing the photoresist layer 98 in three dimensions. Depending on whether the photoresist is a positive or negative resist, the cured or uncured regions of the photoresist layer 98 can be removed, for example, using a suitable chemical solution.

The method, therefore, uses the materials properties of the photoresist layer 98, that is its photodefinability, to produce the surface profile 97' that is then transferred to the surface 89 of the wafer 80 on which the photoresist layer 98 is positioned during the plasma etching process.

Figure 8:
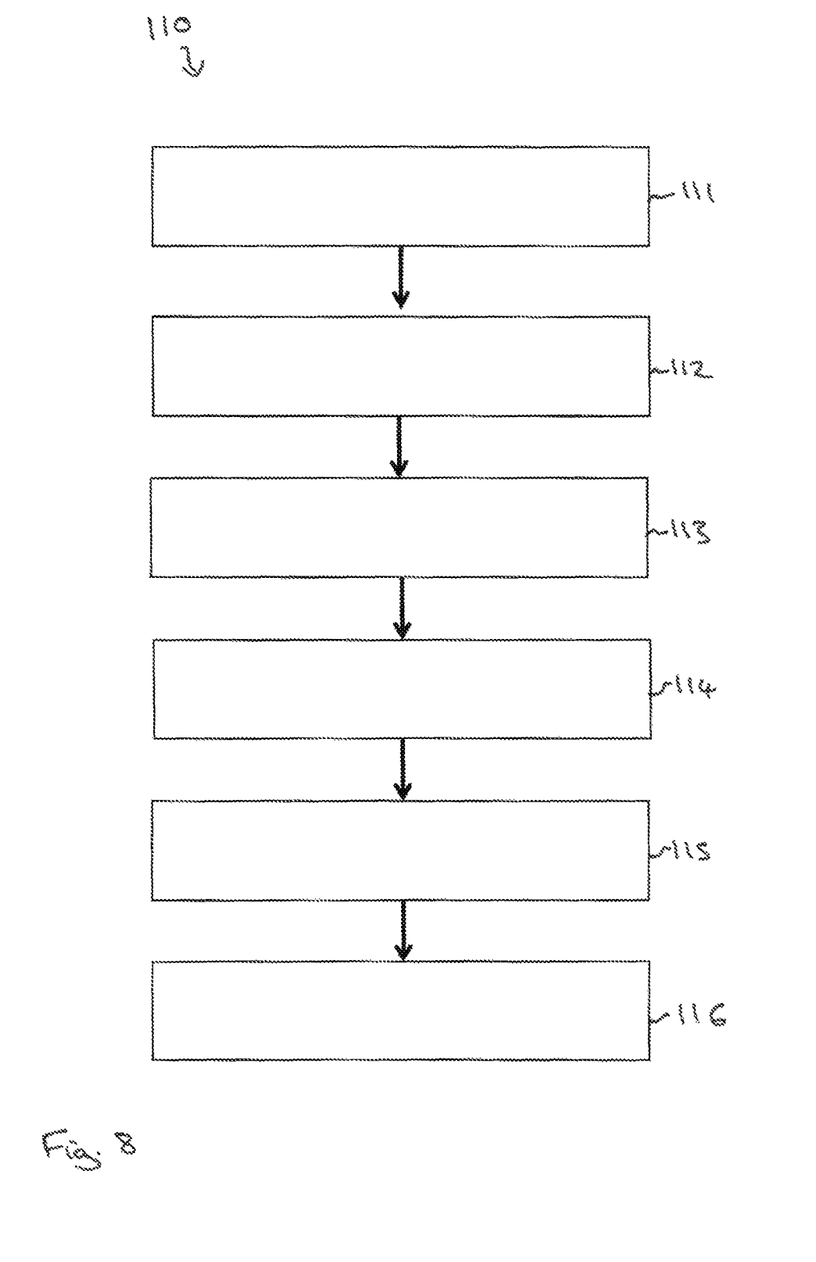
FIG. 8 illustrates a flowchart of a method for fabricating a semiconductor device.

FIG. 8 illustrates a flowchart 110 of a method for fabricating a semiconductor device. A semiconductor body is provided. The semiconductor body comprises a first major surface, a second major surface opposing the first major surface, at least one transistor device structure, a further device structure, a source pad and a gate pad arranged on the first major surface, and an insulating layer comprising one or more discrete portions arranged on the second major surface. In block 111, a photoresist layer is deposited onto the second major surface of the semiconductor body. In block 112, the surface roughness of predefined areas of the photoresist layer is increased and a surface profile is produced. The surface profile provides an outer surface to the photoresist layer that has an increased roughness over the initial roughness of the outer surface of the photoresist layer. The surface roughness of the photoresist layer may be increased by spatially non-uniformly illuminating the photoresist layer to create spatially non-uniform curing of the photoresist layer. In block 113, the semiconductor body is plasma etched with the photoresist layer in place on the second major surface, whereby the surface profile of the photoresist layer is transferred to the second major surface of the semiconductor body such that the second major surface is roughened in regions laterally adjacent the discrete portions of the insulating layer. In some embodiments, a structure mask is applied to the photoresist layer such that predefined regions of the photoresist layer are roughened, and the covered regions of the photoresist layer remain unroughened. In block 114, a seed layer is deposited on the roughened regions and on the discrete portions of the insulating layer. In block 115, a conductive layer is deposited on the seed layer. In some embodiments, the seed layer and the conductive layer are formed in a single process. The seed layer and the conductive layer may be formed on the discrete portions of the insulating layer as well as on the second major surface of the semiconductor device. In block 116, the seed layer and the conductive layer are structured and a drain pad and at least one further contact pad are formed on the second major surface, the further contact pad being electrically coupled to the further device structure. The drain pad may be in direct contact with the second major surface over its entire lateral area, whereas at least a portion of the further contact pad is spaced apart from the second major surface by the discrete portion of the insulating layer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body comprising a first major surface, a second major surface opposing the first major surface and at least one transistor device structure;
    a source pad and a gate pad arranged on the first major surface;
    a drain pad and at least one further contact pad coupled to a further device structure, the drain pad and the at least one further contact pad being arranged on the second major surface.

2. The semiconductor device of claim 1, further comprising an insulating layer, wherein the at least one further contact pad is electrically insulated from the semiconductor body by a discrete portion of the insulating layer that is arranged between the at least one further contact pad and the second major surface.

3. The semiconductor device of claim 2, wherein the insulating layer comprises a discrete portion comprising an aperture, and wherein the at least one further contact pad extends into the aperture and is in contact with the second major surface.

4. The semiconductor device of claim 3, wherein the discrete portion of the insulating layer comprises a ring shape.

5. The semiconductor device of claim 4, wherein the discrete portion further comprises an extension extending from at least one side of the ring-shape.

6. The semiconductor device of claim 2, wherein the second major surface further comprises:
    a roughened surface in regions uncovered by the insulating layer; and
    a seed layer on the roughened surface,
        wherein the at least one further contact pad is arranged on the seed layer.

7. The semiconductor device of claim 6, wherein the second major surface further comprises at least one unroughened region.

8. The semiconductor device of claim 7, wherein the at least one unroughened region is arranged in a kerf region and/or underneath the insulating layer.

9. The semiconductor device of claim 1, wherein the further device structure includes a conductive via electrically coupled to the at least one further contact pad and electrically insulated from the semiconductor body.

10. A semiconductor component, comprising:
    the semiconductor device of claim 1; and
    a substrate with a conductive redistribution structure,
        wherein the first major surface of the semiconductor body faces the conductive redistribution structure,
        wherein the drain pad is electrically coupled to a first portion of the conductive redistribution structure by a bond wire or a contact clip,
        wherein the at least one further contact pad is electrically coupled to a second portion of the conductive redistribution structure by a bond wire.

11. The semiconductor device of claim 1, wherein the further device structure includes a substructure with which a parameter of a device can be changed.

12. A semiconductor device, comprising:
a semiconductor body comprising a first major surface, a second major surface opposing the first major surface and at least one transistor device structure;
a source pad and a gate pad arranged on the first major surface;
a drain pad and at least one further contact pad coupled to a further device structure, the drain pad and the at least one further contact pad being arranged on the second major surface;
an insulating layer, wherein the at least one further contact pad is electrically insulated from the semiconductor body by a discrete portion of the insulating layer that is arranged between the at least one further contact pad and the second major surface;
a roughened surface in regions uncovered by the insulating layer; and
a seed layer on the roughened surface,
wherein the at least one further contact pad is arranged on the seed layer.

13. The semiconductor device of claim 12, wherein the further device structure includes a substructure with which a parameter of a device can be changed.

14. The semiconductor device of claim 13, wherein the second major surface further comprises at least one unroughened region.

15. The semiconductor device of claim 14, wherein the at least one unroughened region is arranged in a kerf region and/or underneath the insulating layer.

16. A semiconductor device, comprising:
a semiconductor body comprising a first major surface, a second major surface opposing the first major surface and at least one transistor device structure;
a source pad and a gate pad arranged on the first major surface; and
a drain pad and at least one further contact pad coupled to a further device structure, the drain pad and the at least one further contact pad being arranged on the second major surface;
wherein the further device structure includes a substructure with which a parameter of a device can be changed.

17. The semiconductor device of claim 16, further comprising an insulating layer, wherein the at least one further contact pad is electrically insulated from the semiconductor body by a discrete portion of the insulating layer that is arranged between the at least one further contact pad and the second major surface.

18. The semiconductor device of claim 17, wherein the second major surface further comprises:
a roughened surface in regions uncovered by the insulating layer; and
a seed layer on the roughened surface,
wherein the at least one further contact pad is arranged on the seed layer.

19. The semiconductor device of claim 18, wherein the second major surface further comprises at least one unroughened region.

20. The semiconductor device of claim 19, wherein the at least one unroughened region is arranged in a kerf region and/or underneath the insulating layer.

* * * * *